United States Patent
Chen

(10) Patent No.: US 8,780,243 B2
(45) Date of Patent: Jul. 15, 2014

(54) IMAGE SENSOR MODULE AND CAMERA MODULE USING SAME

(71) Applicant: Hon Hai Precision Industry Co., Ltd., New Taipei (TW)

(72) Inventor: Shin-Wen Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/727,462

(22) Filed: Dec. 26, 2012

(65) Prior Publication Data

US 2014/0049671 A1 Feb. 20, 2014

(30) Foreign Application Priority Data

Aug. 16, 2012 (TW) .............................. 101129662 A

(51) Int. Cl.
*H04N 5/335* (2011.01)
*H04N 5/225* (2006.01)
*H01L 31/0232* (2014.01)

(52) U.S. Cl.
USPC ............................. 348/294; 348/373; 257/432

(58) Field of Classification Search
CPC ............................ H01L 3/02325; H04N 5/335
USPC .................................... 348/294, 340, 373, 374
See application file for complete search history.

(56) References Cited

U.S. PATENT DOCUMENTS

| | | | |
|---|---|---|---|
| 2005/0285973 A1* | 12/2005 | Singh et al. | 348/374 |
| 2008/0129852 A1* | 6/2008 | Lee | 348/294 |
| 2008/0131112 A1* | 6/2008 | Aoki et al. | 396/429 |
| 2009/0115891 A1* | 5/2009 | Ryu et al. | 348/374 |
| 2011/0194023 A1* | 8/2011 | Tam et al. | 348/374 |

* cited by examiner

*Primary Examiner* — Trung Diep
(74) *Attorney, Agent, or Firm* — Novak Druce Connolly Bove + Quigg LLP

(57) ABSTRACT

An image sensor module includes a rigid-flex board, an image sensor, a supporting plate, and a metal layer. The rigid-flex board defines a through hole penetrating its upper surface and its lower surface. An upper pad is positioned on an upper side surface of the rigid-flex board. The image sensor is positioned on the lower surface, and includes an image surface facing the through hole. A metal layer covers on a top surface and/or a bottom surface of the supporting plate, and a lower pad is positioned on a lower side surface of the supporting plate and connects to the metal layer. The supporting plate is positioned on the lower surface, and the image sensor is received between the rigid-flex board and the supporting plate. The metal sheet is electrically connected between the lower pad and the upper pad.

14 Claims, 5 Drawing Sheets

IMAGE SENSOR MODULE AND CAMERA MODULE USING SAME

BACKGROUND

1. Technical Field

The present disclosure relates to optical modules, and particularly, to an image sensor module and a camera module including the image sensor module.

2. Description of Related Art

Image sensor modules generally include a supporting plate, an image sensor, and a ceramic substrate. The image sensor is positioned on a lower surface of the ceramic substrate by a method of flip-chip package, and is received between the supporting plate and the ceramic substrate. The static electricity accumulated on the ceramic substrate and the electromagnetic signal surrounding the ceramic substrate will interference the image sensor, which will deteriorate the quality of images captured by the image sensor.

Therefore, it is desirable to provide an image sensor module and a camera module, which can overcome the limitations described.

DETAILED DESCRIPTION

Embodiments of the disclosure will be described with reference to the drawings.

Figure 1:
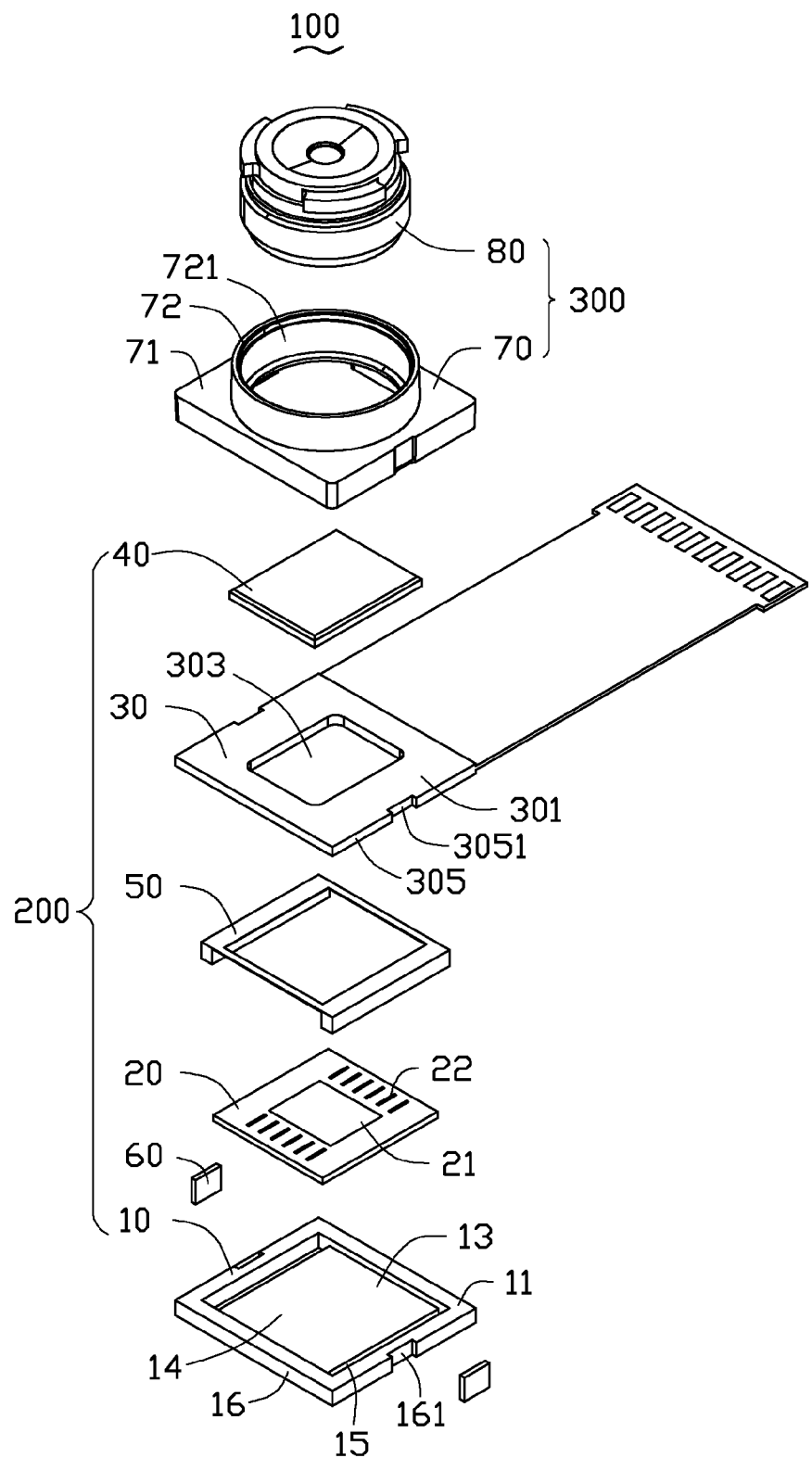
FIG. 1 is an isometric, exploded, and schematic view of a camera module in accordance with an exemplary embodiment.
Figure 2:
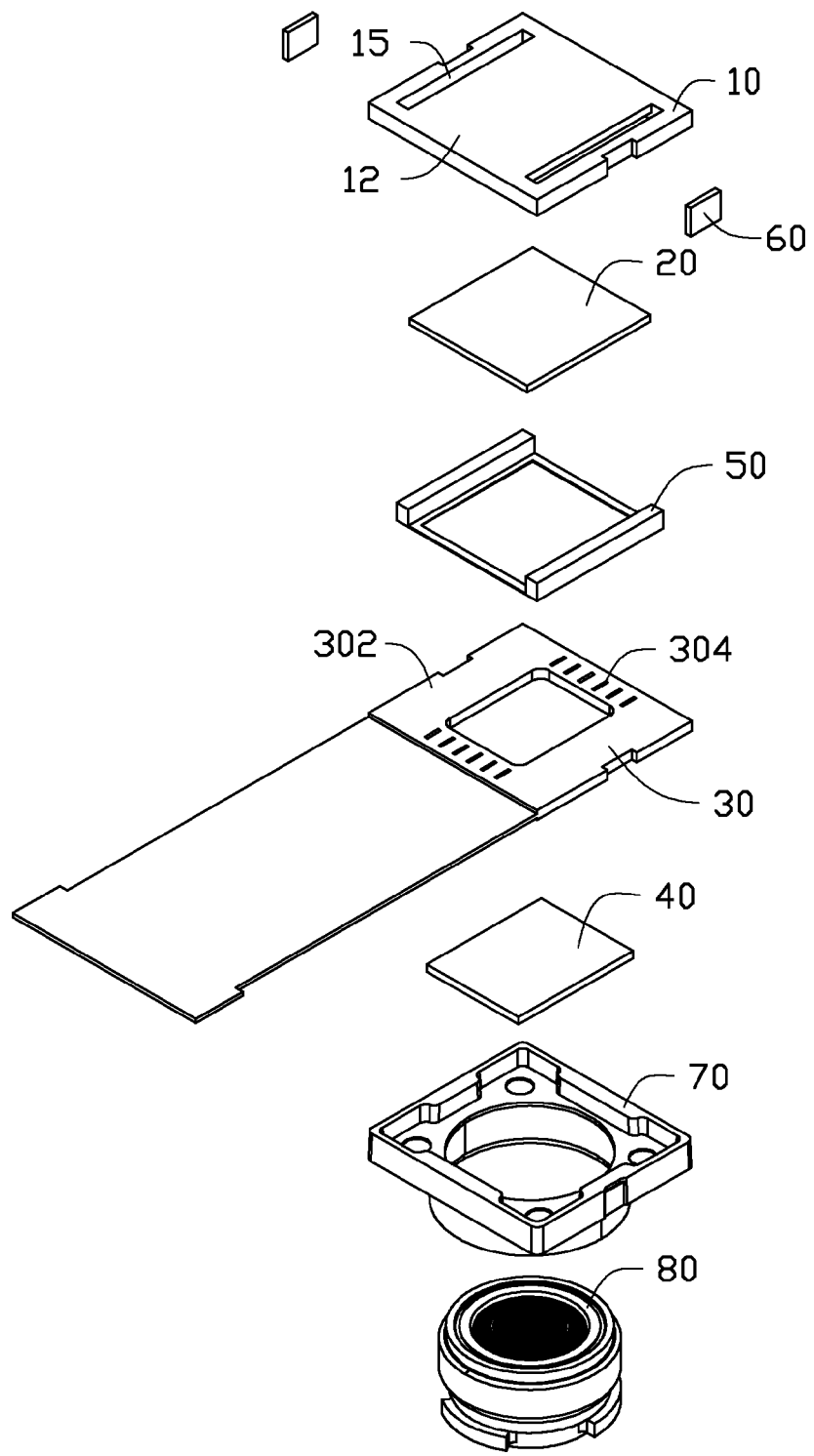
FIG. 2 is similar to FIG. 1, but viewed from another angle.
Figure 5:
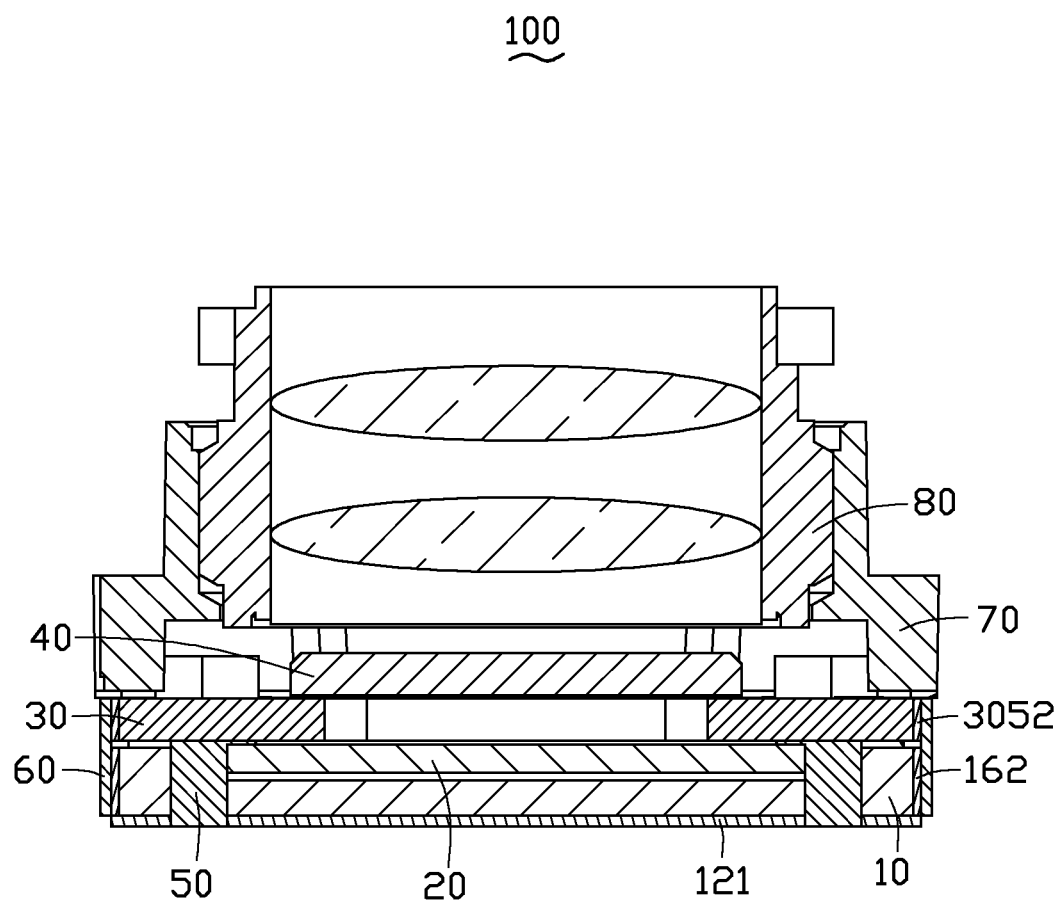
FIG. 5 is a cross-sectional view taken along a line V-V of FIG. 4.

FIGS. 1-2 and 5 show a camera module 100 according to an exemplary embodiment. The camera module 100 includes an image sensor module 200 and a lens module 300 positioned on the image sensor module 200. The image sensor module 200 includes a supporting plate 10, an image sensor 20, a rigid-flex board 30, a filter 40, a glue 50, and at least one metal sheet 60. The lens module 300 includes a lens holder 70 and a lens unit 80.

The supporting plate 10 is rectangular and is formed by injection molding technologies with a plastic material. The supporting plate 10 includes a top surface 11, a bottom surface 12 opposite to the top surface 11, and a lower side surface 16 connected between the top surface 11 and the bottom surface 12. A metal layer 121 is covering the top surface 11 and/or the bottom surface 12. In the embodiment, the metal layer 121 is covering the bottom surface 12 (See FIG. 5).

The supporting plate 10 defines a receiving recess 13 on the top surface 11, generally adjacent to a center of the top surface 11. The receiving recess 13 includes a supporting surface 14 parallel with the bottom surface 12. The supporting plate 10 defines two elongated position recesses 15 penetrating the supporting surface 14 and the bottom surface 12. The two position recesses 15 are parallel with each other, and adjacent to two opposite sides of the supporting surface 14. The supporting plate 10 defines at least one lower notch 161 on the lower side surface 16. In the embodiment, the two opposite sides of the lower side surface 16 respectively defines one lower notch 161. A lower pad 162 is positioned in each lower notch 161, and connects to the metal layer 121.

The image sensor 20 includes an image surface 21 and a number of pins 22 adjacent to two opposite edges of the image surface 21. The image sensor 20 is configured for converting light rays projected on the image surface 21 to image signals in form of electric signals, and the image signals are output from the pins 22. In the embodiment, the image sensor 20 can be a complementary metal-oxide-semiconductor transistor (CMOS) sensor or a charge coupled device (CCD) sensor.

Figure 3:
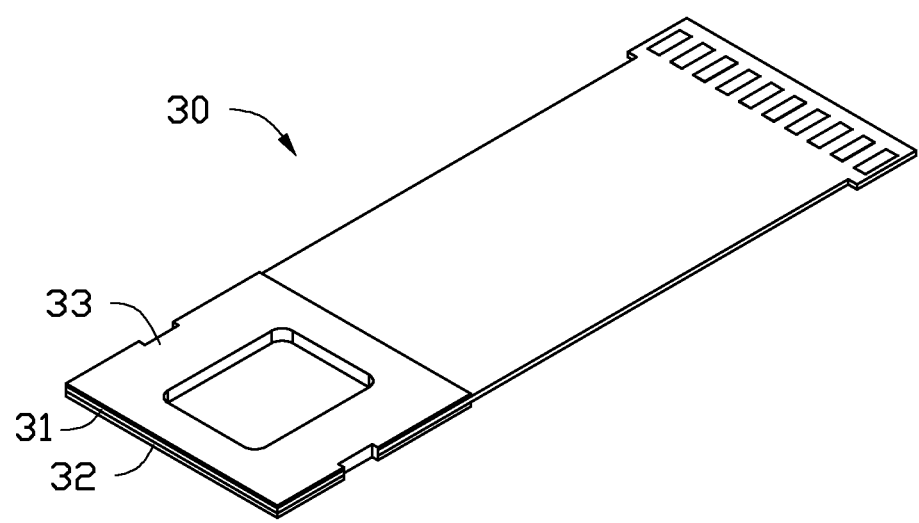
FIG. 3 is an isometric view of a rigid-flex board of the camera module of FIG. 1.

FIG. 3 shows the rigid-flex board 30 of FIG. 1. The rigid-flex board 30 includes a flexible printed circuit board (FPCB) 31, at least one adhering layer 32, and at least one semi-solidified glue layer 33. Both of the area of the adhering layer 32 and the area of the semi-solidified glue layer 33 are less than the area of the FPCB 31. The FPCB 31 is sandwiched the adhering layer 32 and the semi-solidified glue layer 33. The adhering layer 32 and the semi-solidified glue layer 33 are adjacent to one end of the FPCB 31. The adhering layer 32 includes an upper surface 301 facing away the FPCB 31. The semi-solidified glue layer 33 includes a lower surface 302 facing away the FPCB 31. The side surfaces of the FPCB 31, the adhering layer 32, and the semi-solidified glue layer 33 corporately form an upper side surface 305 connected between the upper surface 301 and the lower surface 302.

The rigid-flex board 30 defines a through hole 303 penetrating the upper surface 301 and the lower surface 302. The rigid-flex board 30 includes a number of connecting pads 304. The connecting pads 304 are positioned on the lower surface 302, and generally adjacent to two opposite edges of the through hole 303. The connecting pads 304 are electrically connected to the FPCB 31. A number of electrical elements (not shown), such as resistor and capacitor, are electrically connected on the upper surface 301 surrounding the through hole 303. The rigid-flex board 30 defines at least one upper notch 3051 on the upper side surface 305. In the embodiment, the two opposite sides of the upper side surface 305 respectively defines one upper notch 3051. An upper pad 3052 is positioned in each upper notch 301, and connects to the FPCB 31.

The filter 40 is rectangular, and is made of transparent materials, such as glass. The filter 40 is configured for filtering infrared light out from the light projected thereon.

Figure 4:
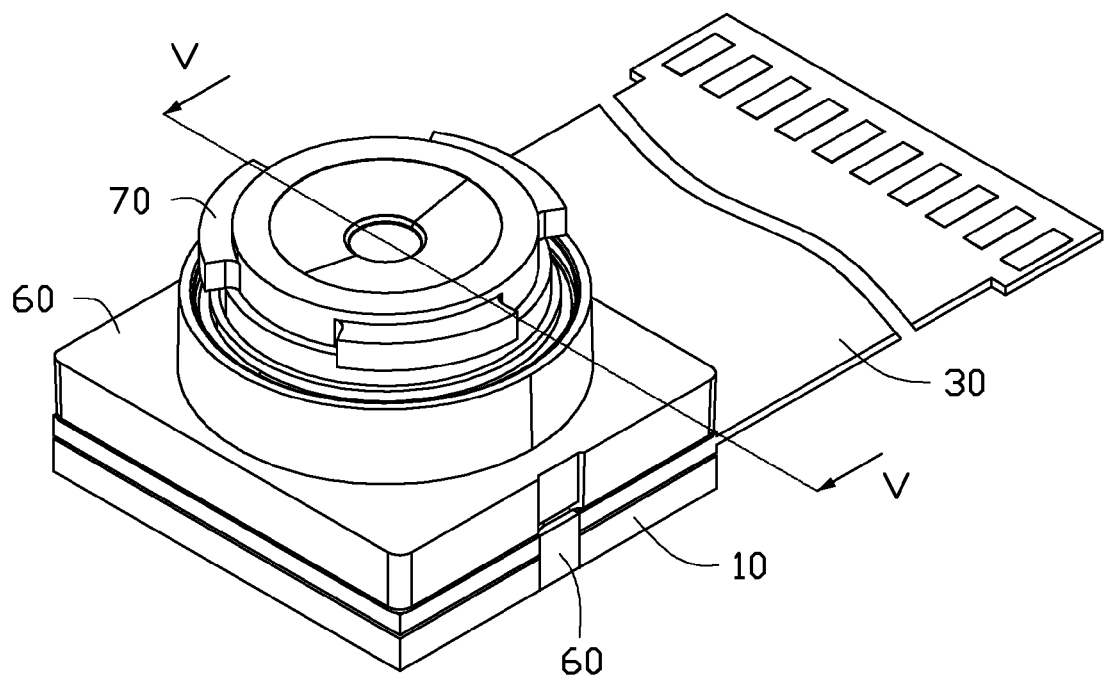
FIG. 4 is an assembled view of the camera module of FIG. 1.

FIGS. 4-5 show an assembling process of the image sensor module 200. The image sensor 20 is positioned on the lower surface 302 of the rigid-flex board 30 by a method of flip-chip package. The pins 22 are electrically connected to the connecting pads 304. The image surface 21 faces and aligns with the through hole 303. The supporting plate 10 is positioned on the lower surface 302 of the rigid-flex board 30, and the image sensor 20 is received in the receiving recess 13 to form an semi-finished product. Each of the lower notches 161 communicates with a respective one of the upper notches 3051.

Then, the semi-finished product is turned 180-degrees in a manner that the supporting plate 10 faces upward and the rigid-flex board 30 faces downward. The glue 50 is applied to the receiving recess 13 through the two position recesses 15 by an injection device (not shown). The glue 50 surrounds the image sensor 20. After the position recesses 15 are filled with the glue 50, the glue 50 is solidified by curing. Each metal sheet 60 is received in the respective lower notch 161 and the respective upper notch 3051, and connects with the respective lower pad 162 and the respective upper pad 3052. At last, the filter 40 is packaged on the upper surface 301 of the rigid-flex board 30, and seals the through hole 303.

The lens holder 70 includes a seat 71 and a receiving portion 72 positioned on one end of the seat 71. The seat 71 is hollow shaped. The receiving portion 72 defines a lens hole 721 communicating with the seat 71. The lens unit 80 is received in the lens hole 721, and includes at least one lens (not shown) and a barrel receiving the at least one lens.

In the process of assembling the camera module 100, the lens holder 70 receiving the lens unit 80 is positioned on the upper surface 301 of the rigid-flex board 30. The seat 71 surrounds the through hole 303. The filter 40 is received in the seat 71. The optical axis of the lens unit 80 is collinear with the optical axis of the image sensor 20.

In use, the image sensor 20 converts the light rays penetrating the lens module 300 into the image signals. The image signals are output to the FPCB 31 of the rigid-flex board 30 through the pins 22 and the connecting pads 304. As the rigid-flex board 30 is electrically connected to the metal layer 121 of the supporting plate 10 through the upper pads 3052, the metal sheets 60, and the lower pads 162, the static electricity accumulated on the rigid-flex board 30 is conducted to the metal layer 121. Furthermore, the metal layer 121 can shield the electromagnetic signal surrounding the camera module 100.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An image sensor module, comprising:
   a rigid-flex board comprising an upper surface, a lower surface opposite to the upper surface, and an upper side surface connected between the upper surface and the lower surface; the rigid-flex board defining a through hole penetrating the upper surface and the lower surface, the rigid-flex board comprising an upper pad positioned on the upper side surface;
   an image sensor positioned on the lower surface of the rigid-flex board, and comprising an image surface facing and aligning with the through hole;
   a supporting plate comprising a top surface, a bottom surface opposite to the top surface, and a lower side surface connected between the top surface and the bottom surface; the supporting plate comprising a metal layer and a lower pad, the metal layer covering on the top surface and/or the bottom surface, the lower pad positioned on the lower side surface and connecting to the metal layer; the supporting plate positioned on the lower surface of the rigid-flex board, and the image sensor received between the rigid-flex board and the supporting plate; and
   a metal sheet electrically connecting the lower pad to the upper pad.

2. The image sensor module of claim 1, wherein the supporting plate defines a receiving recess on the top surface, and the receiving recess receives the image sensor therein.

3. The image sensor module of claim 1, wherein the rigid-flex board comprises a flexible printed circuit board (FPCB), an adhering layer, and a semi-solidified glue layer; the FPCB is sandwiched between the adhering layer and the semi-solidified glue layer; the adhering layer comprises the upper surface facing away the FPCB; the semi-solidified glue layer comprises the lower surface facing away the FPCB.

4. The image sensor module of claim 3, wherein the upper pad positioned on the rigid-flex board is electrically connected to the FPCB.

5. The image sensor module of claim 1, wherein the metal layer covers on the bottom surface of the supporting plate.

6. The image sensor module of claim 1, wherein the supporting plate defines a lower notch on the lower side surface, and the lower pad is positioned in the lower notch.

7. The image sensor module of claim 1, wherein the rigid-flex board defines an upper notch on the upper side surface, and the upper pad is positioned in the upper notch.

8. A camera module, comprising:
   an image sensor module, comprising:
      a rigid-flex board comprising an upper surface, a lower surface opposite to the upper surface, and an upper side surface connected between the upper surface and the lower surface; the rigid-flex board defining a through hole penetrating the upper surface and the lower surface, the rigid-flex board comprising an upper pad positioned on the upper side surface;
      an image sensor positioned on the lower surface of the rigid-flex board, and comprising an image surface facing and aligning with the through hole;
      a supporting plate comprising a top surface, a bottom surface opposite to the top surface, and a lower side surface connected between the top surface and the bottom surface; the supporting plate comprising a metal layer and a lower pad, the metal layer covering on the top surface and/or the bottom surface, the lower pad positioned on the lower side surface and connecting to the metal layer; the supporting plate positioned on the lower surface of the rigid-flex board, and the image sensor received between the rigid-flex board and the supporting plate; and
      a metal sheet electrically connecting the lower pad to the upper pad; and
   a lens module, comprising:
      a lens holder positioned on the upper surface of the rigid-flex board; and
      a lens unit received in the lens holder.

9. The camera module of claim 8, wherein the supporting plate defines a receiving recess on the top surface, and the receiving recess receives the image sensor therein.

10. The camera module of claim 8, wherein the rigid-flex board comprises a flexible printed circuit board (FPCB), an adhering layer, and a semi-solidified glue layer; the FPCB is sandwiched between the adhering layer and the semi-solidified glue layer; the adhering layer comprises the upper surface facing away the FPCB; the semi-solidified glue layer comprises the lower surface facing away the FPCB.

11. The camera module of claim 10, wherein the upper pad positioned on the rigid-flex board is electrically connected to the FPCB.

12. The camera module of claim 8, wherein the metal layer covers on the bottom surface of the supporting plate.

13. The camera module of claim 8, wherein the supporting plate defines a lower notch on the lower side surface, and the lower pad is positioned in the lower notch.

14. The camera module of claim 8, wherein the rigid-flex board defines an upper notch on the upper side surface, and the upper pad is positioned in the upper notch.

* * * * *